(12) United States Patent
Lin et al.

(10) Patent No.: US 7,977,763 B2
(45) Date of Patent: Jul. 12, 2011

(54) CHIP PACKAGE WITH DIE AND SUBSTRATE

(75) Inventors: Mou-Shiung Lin, Hsinchu (TW);
Jin-Yuan Lee, Hsin-Chu (TW);
Ching-Cheng Huang, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 10/996,537

(22) Filed: Nov. 24, 2004

(65) Prior Publication Data
US 2005/0090099 A1 Apr. 28, 2005

Related U.S. Application Data

(60) Continuation of application No. 10/690,350, filed on Oct. 21, 2003, now abandoned, which is a division of application No. 10/054,001, filed on Jan. 19, 2002, now Pat. No. 6,673,698.

(51) Int. Cl.
*H01L 23/58* (2006.01)
*H05K 7/00* (2006.01)

(52) U.S. Cl. ........ 257/516; 257/700; 257/723; 257/758; 257/E23.019; 361/820

(58) Field of Classification Search .............. 438/33, 438/68, 108, 110, 113, 114, 115, 122, 458, 438/459, 460, 462, 464, 465, 622, 365, 386, 438/387
See application file for complete search history.

(56) References Cited

U.S. PATENT DOCUMENTS

| | | | |
|---|---|---|---|
| 5,055,321 A * | 10/1991 | Enomoto et al. | 427/97.2 |
| 5,366,906 A * | 11/1994 | Wojnarowski et al. | 438/17 |
| 5,388,328 A * | 2/1995 | Yokono et al. | 29/852 |
| 5,432,675 A * | 7/1995 | Sorimachi et al. | 361/719 |
| 5,483,421 A | 1/1996 | Gedney et al. | |
| 5,548,091 A | 8/1996 | DiStefano et al. | |
| 5,565,706 A | 10/1996 | Miura et al. | 257/723 |
| 5,663,106 A | 9/1997 | Karavakis et al. | |
| 5,776,796 A | 7/1998 | DiStefano et al. | |
| 5,834,339 A | 11/1998 | DiStefano et al. | |
| 5,841,193 A | 11/1998 | Eichelberger | 257/723 |
| 5,874,770 A | 2/1999 | Saia et al. | 257/536 |
| 5,875,545 A | 3/1999 | DiStefano et al. | |
| 6,008,070 A | 12/1999 | Farnworth | |
| 6,030,856 A | 2/2000 | DiStefano et al. | |
| 6,045,655 A | 4/2000 | DiStefano et al. | |
| 6,046,076 A | 4/2000 | Mitchell et al. | |

(Continued)

FOREIGN PATENT DOCUMENTS

| | | |
|---|---|---|
| TW | 403980 | 9/2000 |
| TW | 444370 | 7/2001 |
| TW | 531854 | 5/2003 |
| TW | 90123655 | 5/2003 |

OTHER PUBLICATIONS

Microelectronic Packaging Handbook; Chapter 9, R.R. Tummala et al., Van Nostrand Reinhold, NY, 1989, pp. 673-725.

(Continued)

*Primary Examiner* — Alonzo Chambliss
(74) *Attorney, Agent, or Firm* — McDermott Will & Emery LLP

(57) ABSTRACT

A thin film semiconductor die circuit package is provided utilizing low dielectric constant (k) polymer material for the insulating layers of the metal interconnect structure. Five embodiments include utilizing glass, glass-metal composite, and glass/glass sandwiched substrates. The substrates form the base for mounting semiconductor dies and fabricating the thin film interconnect structure.

29 Claims, 24 Drawing Sheets

U.S. PATENT DOCUMENTS

| | | |
|---|---|---|
| 6,080,605 A | 6/2000 | DiStefano et al. |
| 6,093,584 A | 7/2000 | Fjelstad |
| 6,107,123 A | 8/2000 | DiStefano et al. |
| 6,121,688 A | 9/2000 | Akagawa ............... 257/778 |
| 6,126,428 A | 10/2000 | Mitchell et al. |
| 6,130,116 A | 10/2000 | Smith et al. |
| 6,168,965 B1 | 1/2001 | Malinovich |
| 6,169,319 B1 | 1/2001 | Malinovich |
| 6,177,293 B1 | 1/2001 | Netzer |
| 6,202,299 B1 | 3/2001 | DiStefano et al. |
| 6,204,091 B1 | 3/2001 | Smith et al. |
| 6,218,215 B1 | 4/2001 | DiStefano et al. |
| 6,221,687 B1 | 4/2001 | Abramovich |
| 6,225,013 B1 | 5/2001 | Cohen |
| 6,228,687 B1 | 5/2001 | Akram et al. |
| 6,232,152 B1 | 5/2001 | DiStefano et al. |
| 6,255,738 B1 | 7/2001 | DiStefano et al. |
| 6,284,573 B1 | 9/2001 | Farnworth |
| 6,285,065 B1 | 9/2001 | Levy |
| 6,288,434 B1 | 9/2001 | Levy |
| 6,294,040 B1 | 9/2001 | Raab et al. |
| 6,309,915 B1 | 10/2001 | DiStefano |
| 6,326,697 B1 | 12/2001 | Farnworth |
| 6,329,224 B1 | 12/2001 | Nguyen et al. |
| 6,359,335 B1 | 3/2002 | DiStefano et al. |
| 6,362,498 B2 | 3/2002 | Abramovich |
| 6,373,141 B1 | 4/2002 | DiStefano et al. |
| 6,383,916 B1 | 5/2002 | Lin ............... 438/637 |
| 6,388,340 B2 | 5/2002 | DiStefano |
| 6,396,148 B1 | 5/2002 | Eichelberger et al. ........ 257/758 |
| 6,429,036 B1 | 8/2002 | Nixon |
| 6,440,834 B2 * | 8/2002 | Daubenspeck et al. ....... 438/601 |
| 6,445,064 B1 | 9/2002 | Ishii |
| 6,458,681 B1 | 10/2002 | DiStefano et al. |
| 6,460,245 B1 | 10/2002 | DiStefano |
| 6,555,908 B1 | 4/2003 | Eichelberger et al. |
| 6,602,740 B1 | 8/2003 | Mitchell |
| 6,610,621 B2 * | 8/2003 | Masuko ............... 501/32 |
| 6,617,174 B2 | 9/2003 | Rotstein |
| 6,653,172 B2 | 11/2003 | DiStefano et al. |
| 6,673,698 B1 * | 1/2004 | Lin et al. ............... 438/459 |
| 6,686,015 B2 | 2/2004 | Raab et al. |
| 6,746,898 B2 * | 6/2004 | Lin et al. ............... 438/113 |
| 6,780,747 B2 | 8/2004 | DiStefano et al. |
| 6,800,941 B2 | 10/2004 | Lee et al. ............... 257/773 |
| 6,885,107 B2 | 4/2005 | Kinsman |
| 7,172,922 B2 | 2/2007 | Benjamin |
| 7,272,888 B2 | 9/2007 | DiStefano |
| 7,454,834 B2 | 11/2008 | DiStefano |
| 2001/0021541 A1 | 9/2001 | Akram et al. ............... 438/106 |
| 2002/0006718 A1 | 1/2002 | DiStefano |
| 2002/0007904 A1 | 1/2002 | Raab et al. |
| 2002/0070443 A1 | 6/2002 | Mu et al. ............... 257/712 |
| 2002/0074641 A1 | 6/2002 | Towle et al. ............... 257/692 |
| 2002/0094671 A1 | 7/2002 | DiStefano et al. |
| 2002/0137263 A1 | 9/2002 | Towle et al. ............... 438/127 |
| 2002/0168797 A1 | 11/2002 | DiStefano et al. |
| 2002/0184758 A1 | 12/2002 | DiStefano |
| 2003/0027373 A1 | 2/2003 | DiStefano et al. |
| 2003/0122243 A1 | 7/2003 | Lee et al. ............... 257/700 |
| 2003/0122246 A1 | 7/2003 | Lin et al. ............... 257/723 |
| 2003/0205804 A1 | 11/2003 | Lee et al. ............... 257/703 |
| 2004/0046254 A1 | 3/2004 | Lin et al. ............... 257/734 |
| 2004/0084741 A1 | 5/2004 | Boon |
| 2004/0119097 A1 | 6/2004 | Lee et al. ............... 257/200 |
| 2004/0140556 A1 | 7/2004 | Lin et al. ............... 257/723 |
| 2004/0169264 A1 | 9/2004 | Lee et al. ............... 257/678 |
| 2005/0121771 A1 | 6/2005 | Lin et al. ............... 257/700 |
| 2005/0184358 A1 * | 8/2005 | Lin ............... 257/531 |
| 2005/0208757 A1 * | 9/2005 | Lin ............... 438/622 |
| 2006/0225272 A1 | 10/2006 | DiStefano |

OTHER PUBLICATIONS

Novel Microelectronic Packaging Method for Reduced Thermomechanical Stresses on Low Dielectric.
Constant Materials, R.M. Emery et al., Itel Corp., Chandler, AZ.
Micro Electronic, Digital and Analog Circuits and Systems: p. 115 & p. 167, Jacob Millman.

Microelectronics Packaging Handbook (Second Edition), Technology Drivers Part I: An overview & 8-2 chip-level interconnection evolution, Rao R. Tummala, Eugene J. Rymaszewski & Alan G. Klopfenstein.
Chip Scale Package, Chapter ten 10.2, Design Concepts, and Package Structure: p. 157-p. 161, John H. Lau & S.W. Ricky Lee, McGraw Hill International, Electrical Series.
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369- 373.
Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects on Power Supply Clamps," Proceedings of the 6th International Sympoisum on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High vol. Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOX) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Lau, John H. et al.: "Chip Scale Package: Design, Materials, Process, Reliability and Applications," Chapter 10.2, Design Concepts and Package Structure, pp. 157-161 (1999).

Millman, Jacob: "Microelectronics Second Edition, McGraw Hill series in Electrical and Computer Engineering: Digital and Analog Circuits and Systems," pp. 115 and 167 (1987).

Tummala, Rao E. et al.: "Microelectronics Packaging Handbook, Technology Drivers, Part I," Second Edition, An Overview and Chapter 8.2 Chip-Level Interconnection Evolution, pp. I-12, I-13, I-64, I-82, I-85 to I-87 and II-133 (1997).

ROC Cancellation Case No. 090131210N01 Third Supplemental Cancellation Brief filed by ACE on May 13, 2010, with English Translated Summary.

"Electronic Materials Handbook, vol. 1—Packaging: Other Design Considerations; Materials and Electronic Phenomena; Physical Characteristics of Microelectronic Materials" ASM International Handbook Committee, pp. 104-111, ASM International (1989).

Kuo, "Semiconductor Packaging Engineering", Zhan Yi-Zheng Publisher, Registration Taipei, Apr. 2000, Table 9.1, with English translation thereof.

* cited by examiner

CHIP PACKAGE WITH DIE AND SUBSTRATE

This is a Continuation of patent application Ser. No. 10/690,350, filing date Oct. 21, 2003, Thin Film Semiconductor Package And Method Of Fabrication, now abandoned, which is a division of patent application Ser. No. 10/054,001, filing date Jan. 19, 2002, Thin Film Semiconductor Package Utilizing a Glass Substrate With Composite Polymer/Metal Interconnect Layers, now U.S. Pat. No. 6,673,698, assigned to the same assignee as the present invention, which are herein incorporated by reference in their entirety.

This application is related to application Ser. No. 10/055,498, filed on Jan. 22, 2002, now U.S. Pat. No. 6,800,941; and related to application Ser. No. 10/454,972, file on Jun. 4, 2003, now pending; and related to application Ser. No. 10/977,289, filed on Oct. 28, 2004, now pending; and related to application Ser. No. 10/055,568, filed on Jan. 22, 2002, now pending; and related to Ser. No. 10/638,018, filed on Aug. 8, 2003, now pending; and related to application Ser. No. 10/174,462, filed on Jun. 17, 2002, now U.S. Pat. No. 6,746,898; and related to application Ser. No. 10/755,042, file on Jan. 9, 2004, now pending; and related to application Ser. No. 10/055,499, filed on Jan. 22, 2002, now pending; and related to application Ser. No. 10/728,150 filed on Dec. 3, 2003; and related to application Ser. No. 10/794,472 file on Mar. 5, 2004, all assigned to a common assignee.

BACKGROUND OF INVENTION (1) Technical Field

This invention relates in general to the interconnection and packaging of semiconductor dies and discrete components.

(2) Description of Prior Art

The following publications relate to the use of thin films in the interconnection and packaging of semiconductor dies.

Microelectronic Packaging Handbook Chapter 9. R. R. Tummala, E. J. Rymaszewski. Van Nostrand Reinhold 1989.

Novel Microelectronic Packaging Method For Reduced Thermomechanical Stresses on Low Dielectric Constant Materials R. M. Emery, S. Towle, H. Braunisch, C. Hu, G. Raiser, G. J. Vandentop. Intel Corp. Chandler, AZ.

The requirements for packaging of semiconductor circuit devices are that the package provides physical protection, thermal control, powering capability, and desirable electrical properties of the interconnections. Semiconductor packages also provide the physical translation of interconnecting wiring structures from the fine wiring and wire spacing, and small area, of the semiconductor chip to the bigger interconnection spacing and larger area of the next level of assembly. This capability is usually referred to as "fan-out". In addition the packages need to provide the ability to integrate passive components, such as capacitors, inductors, resistors, waveguides, filters, MEMS (MicroElectroMechanical) devices, and the like, into the wiring structure.

These demands have been and are currently met by numerous package designs. In general these designs tend to degrade the signals that communicate between devices. Usually this degradation is due to the high dielectric constant materials and high resistance metal used as insulators in the interconnection design. The materials used as insulators; silicon oxides, glass, glass ceramics, or ceramics are chosen for their mechanical properties and the method of fabrication. An important mechanical property is the material's thermal coefficient of expansion, or TCE. The TCE in many package designs needs to match that of the silicon semiconductor die in order to have low mechanical stresses in the package structure.

Materials with low TCE also have high dielectric constants (k). The high dielectric constants result in unwanted electrical properties of the interconnections; i.e., high impedances. Examples of such designs are semiconductor packages that utilize ceramic substrates to mount and interconnect the semiconductor circuits.

In order to take advantage of the high switching speeds of today's digital circuits the interconnection technology both on and off the semiconductor chips or dies requires novel approaches utilizing low dielectric constant (k) materials such as polyimide or BCB (benzocyclobutene) to provide the necessary electrical parameters of the interconnects that do not degrade circuit performance.

The use of low dielectric materials used as insulating layers for interconnects also requires novel mechanical design approaches to minimize the deleterious effects of TCE mismatches.

SUMMARY OF THE INVENTION

The objective of the present invention is to provide a semiconductor interconnecting package design and method of fabrication utilizing polymer thin film techniques.

It is a further objective of the invention that the semiconductor package provide the interconnect density required by the semiconductor design.

It is also the objective of the present invention to provide a semiconductor package that allows for input and output interconnections on a pitch compatible both with the semiconductor and the next level of package.

The capability to place discrete components close to the semiconductor circuit's input and output connections is an additional objective of the present invention.

In addition an objective of the present invention is to utilize current fabrication techniques and existing fabrication infrastructure.

The above objectives are achieved by the present invention by utilizing a glass or glass-metal composite substrate as the basic structure of the package. Semiconductor dies are bonded to the substrates and a thin film structure is fabricated utilizing metal and polymer films to interconnect the semiconductor dies. The glass or glass-metal composite substrate provides the necessary mechanical protection and support to the semiconductor dies. It also provides the planarity necessary for the fabrication of the interconnect polymer layers that interconnect the semiconductors.

DETAILED DESCRIPTION OF THE PREFERRED EMBODIMENT

Figure 1A:
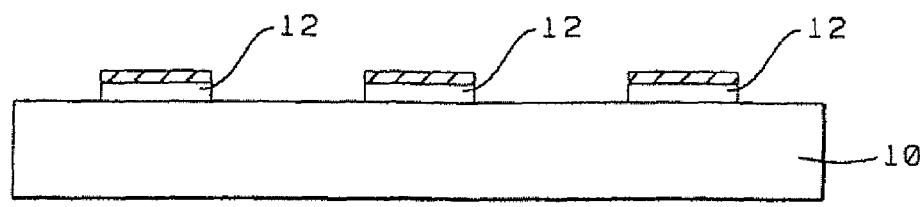
FIGS. 1a-1j show a first embodiment of the invention and the major fabrication steps.
Figure 1B:
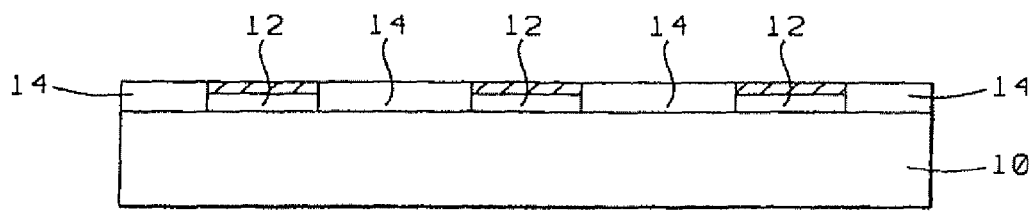
Figure 1C:
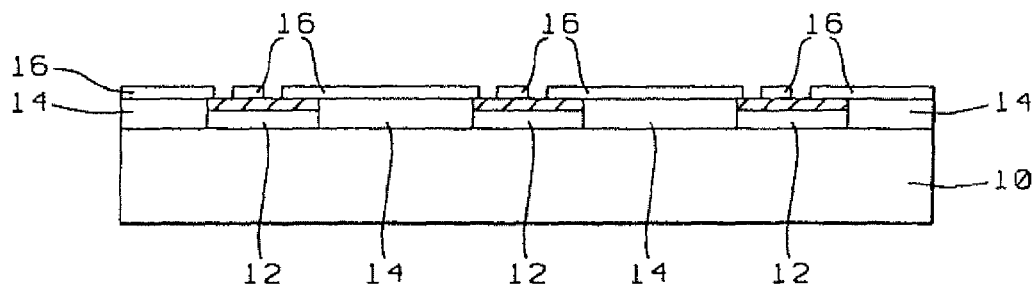
Figure 1D:
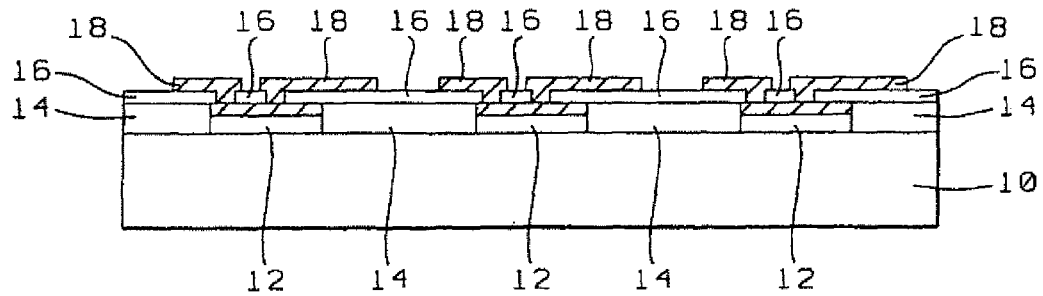
Figure 1E:
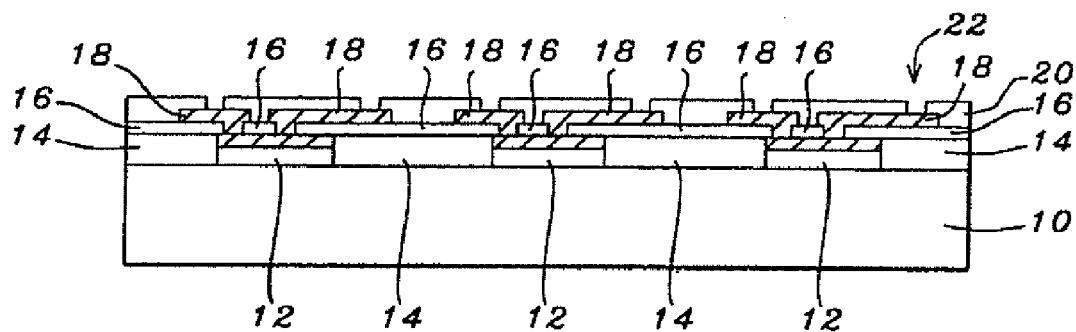
Figure 1F:
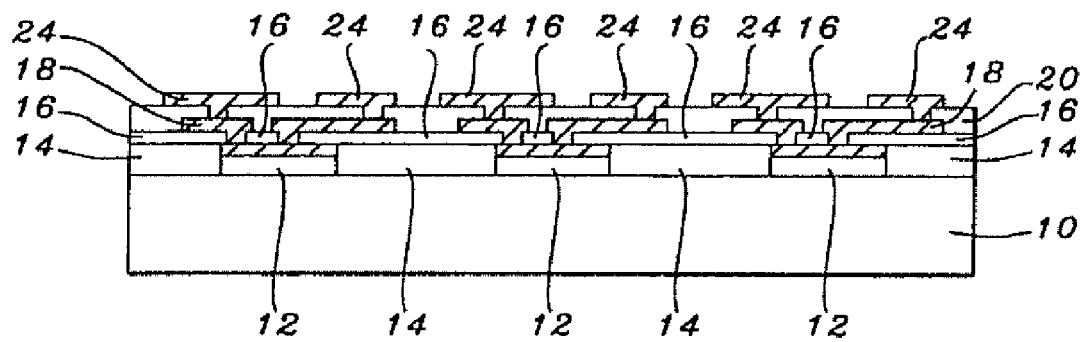
Figure 1G:
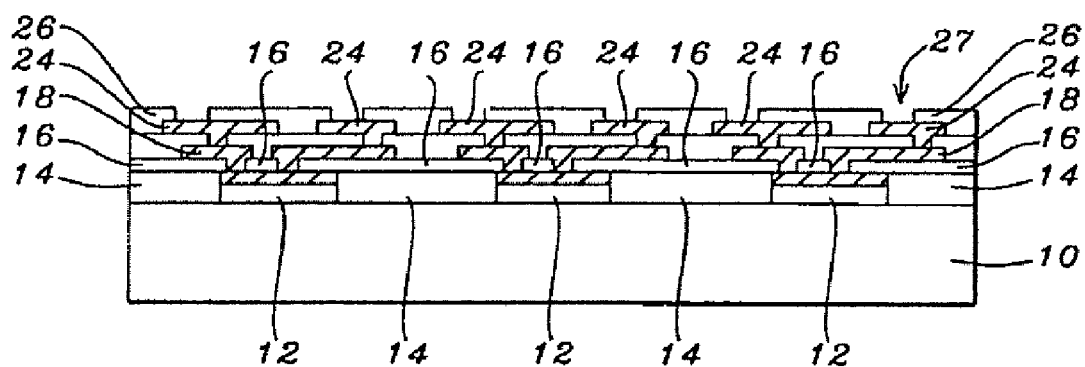
Figure 1H:
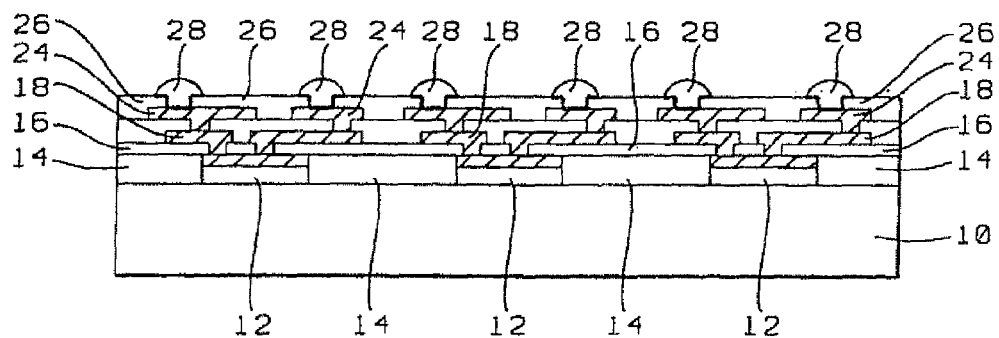

Semiconductor packages provide mechanical protection to the semiconductor dies as well as providing the ability to interconnect the circuits and the circuits to the next level of package. The semiconductor packages also provide the necessary interconnection paths between semiconductor dies when used in multi-chip designs.

One approach to providing interconnection capabilities and connectivity to the next level package, is described in U.S. patent application Ser. No. 09/251,183, filed on Feb. 17, 1999, and herein incorporated by reference. After typical semiconductor processing is completed, including a top passivation layer and exposed metal pads, this application describes a "post passivation process" using thick layers of organic dielectric films, and thick metal layers for signal paths and power/ground busses. Post passivation technology offers low impedance interconnection, passive components and metal bumps (usually solder) based on a wafer level process. However, the wafer level process limits the capability of fan out of pad location to a larger pitch, and limits the capability to integrate more passive components requiring a large area. The invention relies on a separate substrate for the pad fan out and accommodation of more and bigger passive components.

The interconnect technology used needs the ability to provide the necessary fine pitch as required by the semiconductor circuits. Also, the interconnect technology has to provide low impedance interconnects utilizing low dielectric constant (k) insulating layers. The present invention discloses five different embodiments for the thin film semiconductor package structure.

The first embodiment of the present invention as shown in FIGS. 1a-1j utilizes a glass substrate 10. Semiconductor dies 12 are attached by conventional means; i.e., die bonding to the glass substrates face up, at the desired locations. A polymer 14 is optionally used to fill the gaps between the dies and provide a planar surface. This material may also be epoxy, deposited by spin-on, dispense, or screen printing. The first layer of dielectric 16, a polymer such as polyimide, BCB, elastomer and the like, is deposited by spin coating to a thickness of between about 5 and 100 μm. If the polymer or epoxy 14 is not used to fill the gaps between dies, the dielectric 16 is used to fill the gaps. Contact holes to the semiconductor dies are exposed by lithographic and etching techniques to expose the metal contacts on the semiconductor dies. The polymer 16 can be photosensitive material.

Figure 1I:
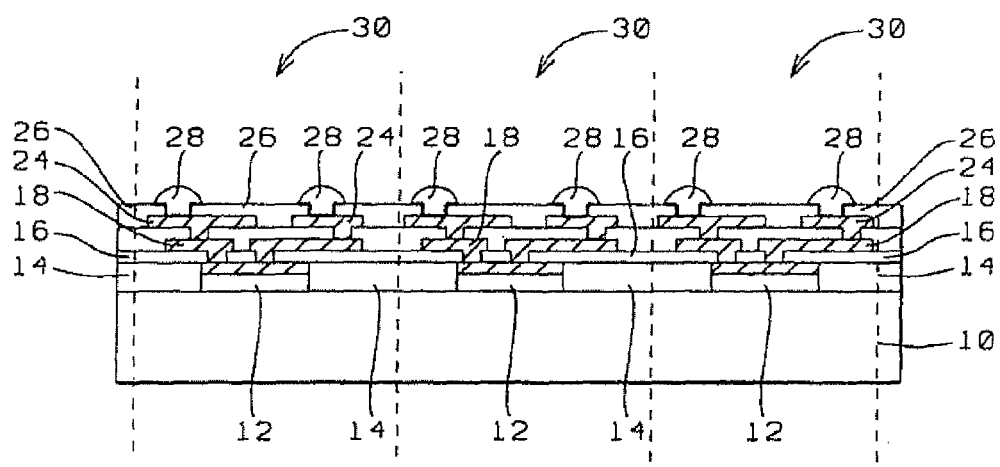
Figure 1J:
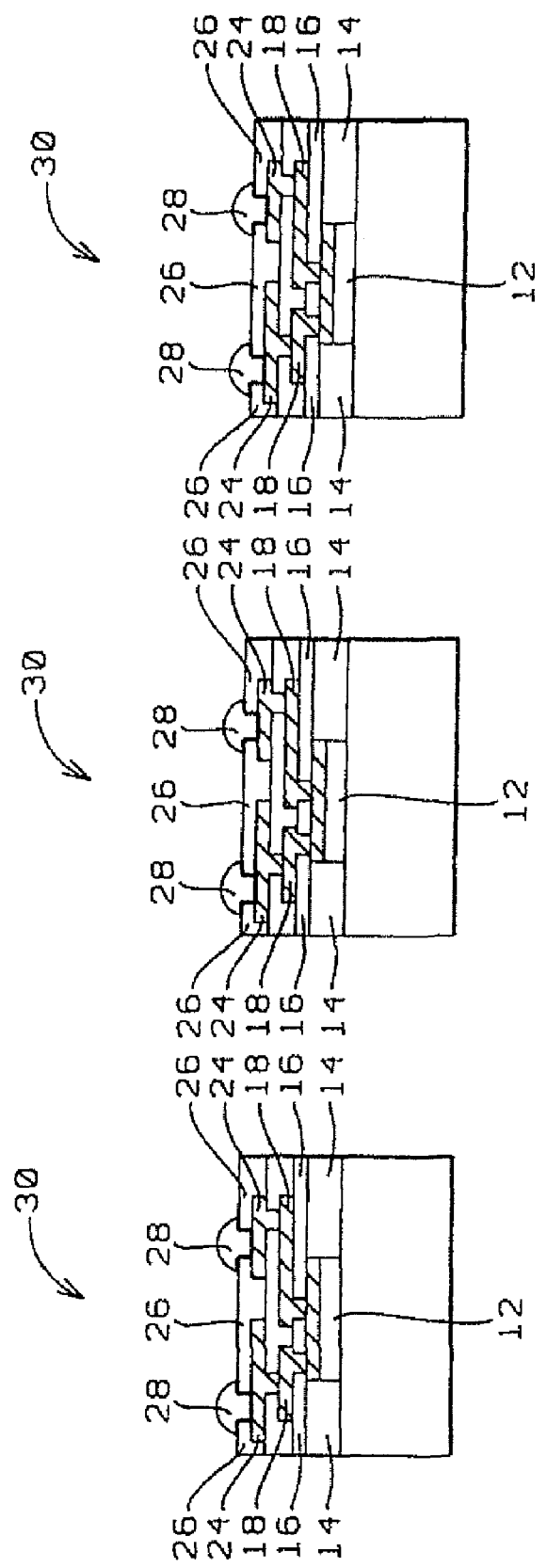
Figure 1K:
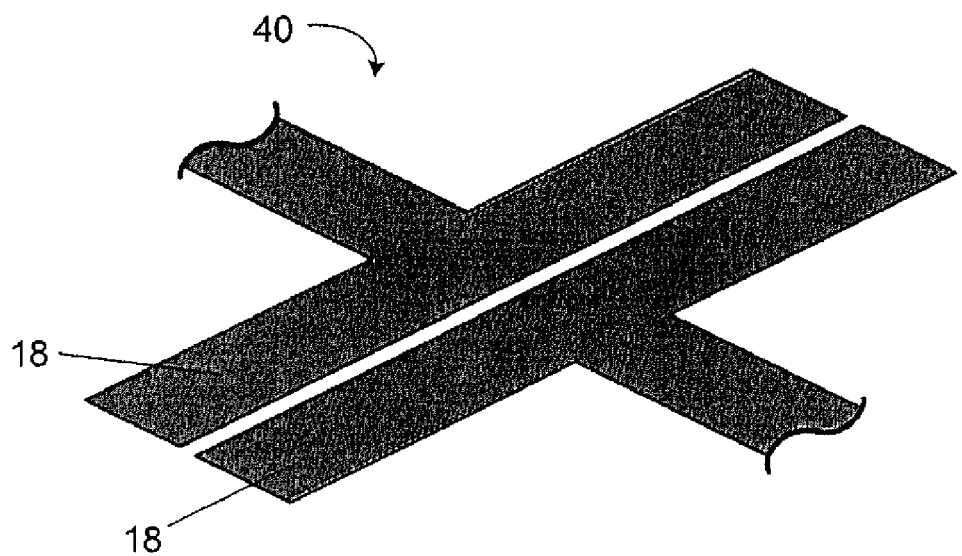
FIGS. 1k-1m show examples of passive devices that may be incorporated into the first metal layer.
Figure 1L:
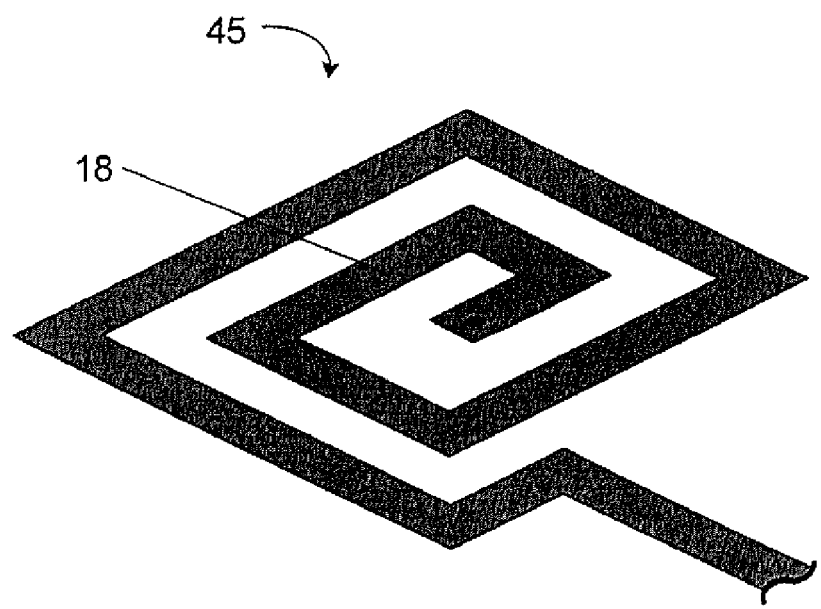
Figure 1M:
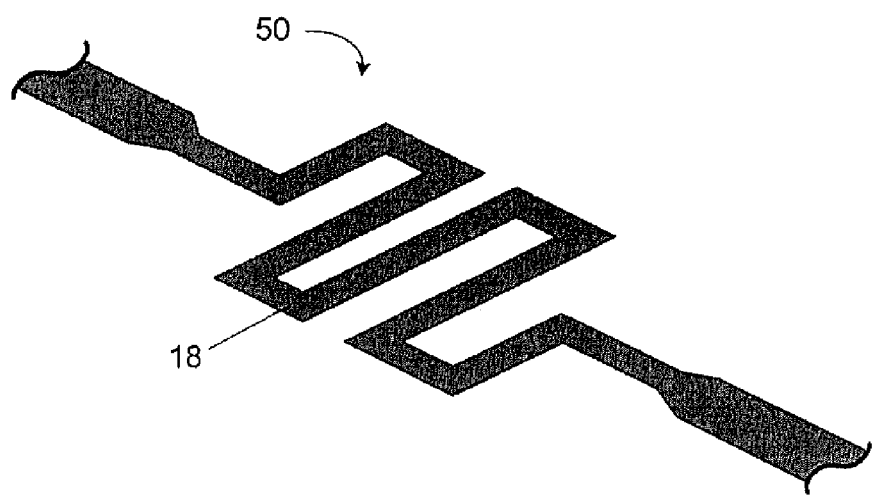
Figure 2A:
FIGS. 2a-2j show a second embodiment of the invention and the major fabrication steps.
Figure 2B:
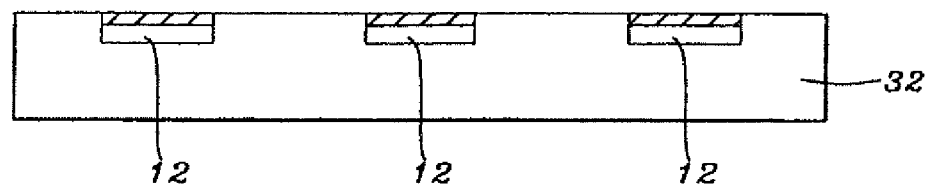
Figure 2C:
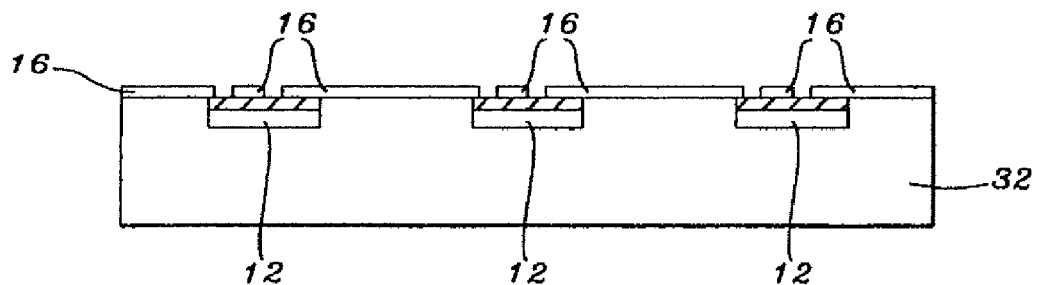
Figure 2D:
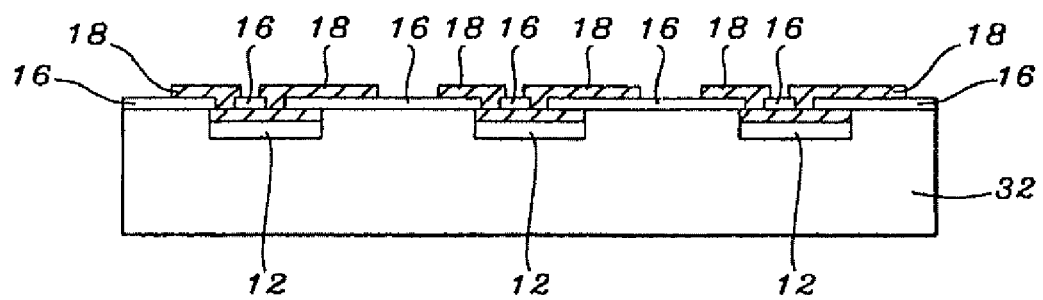
Figure 2E:
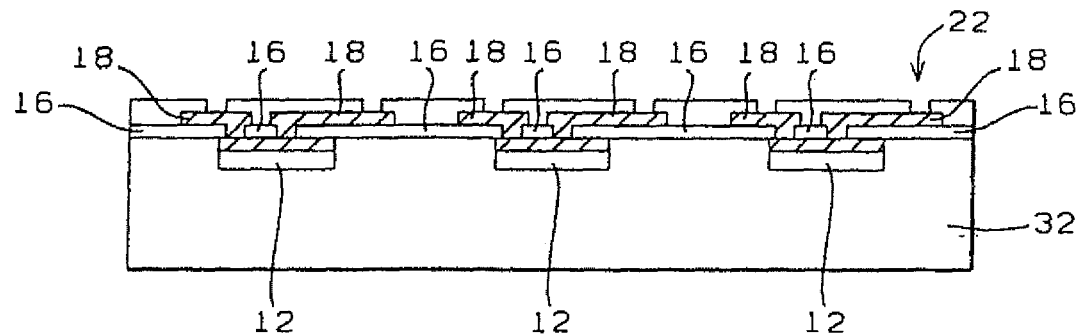
Figure 2F:
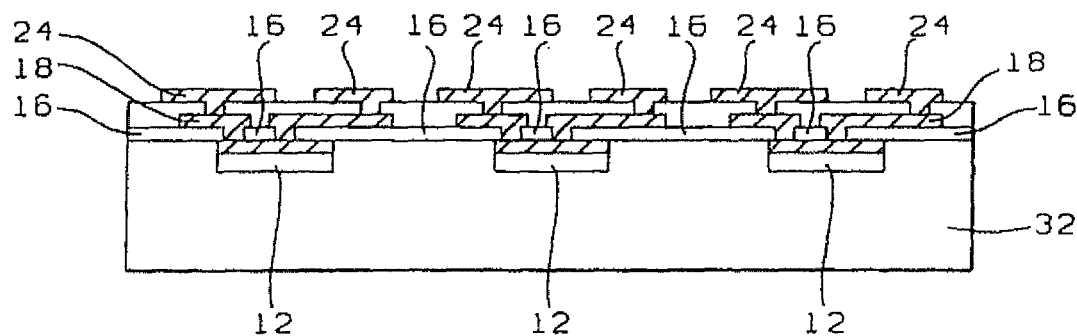
Figure 2G:
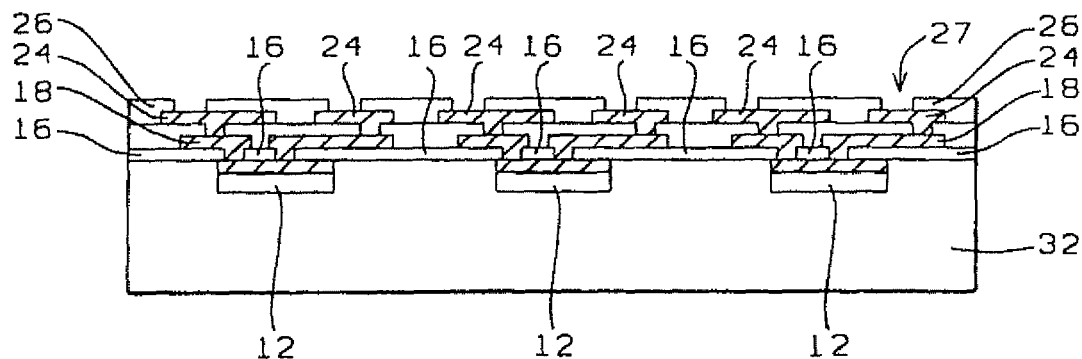
Figure 2H:
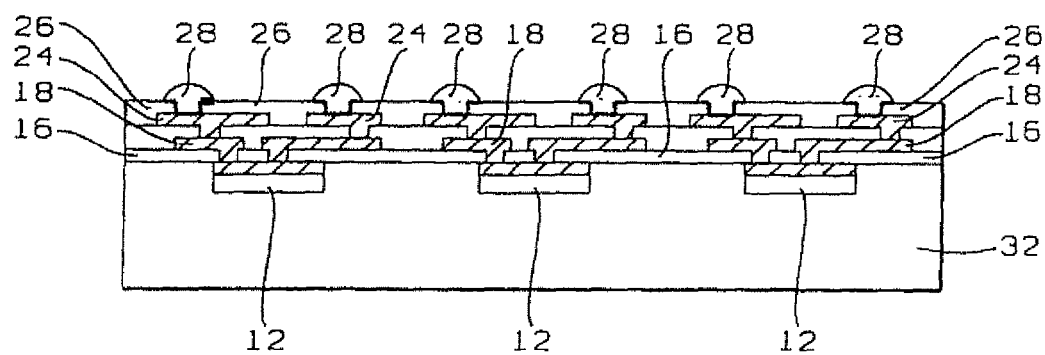
Figure 2I:
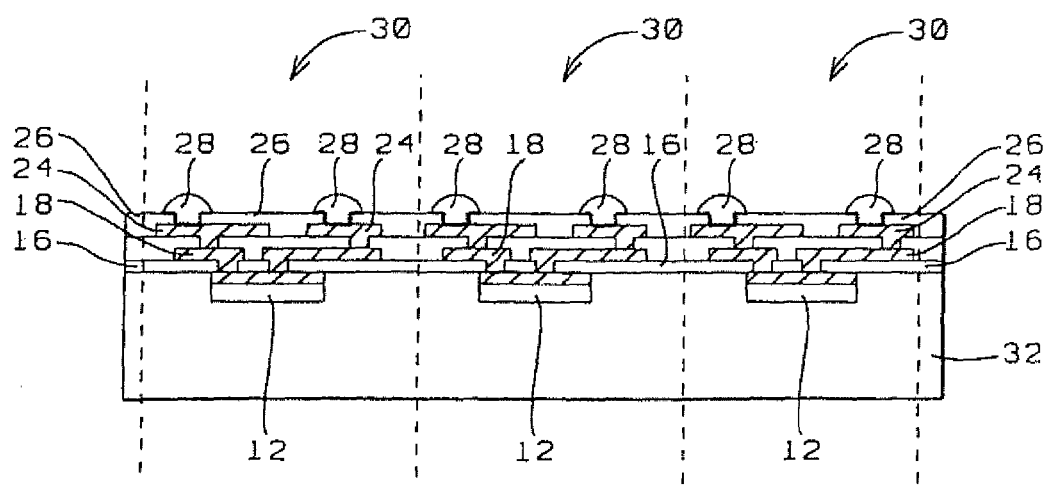
Figure 2J:
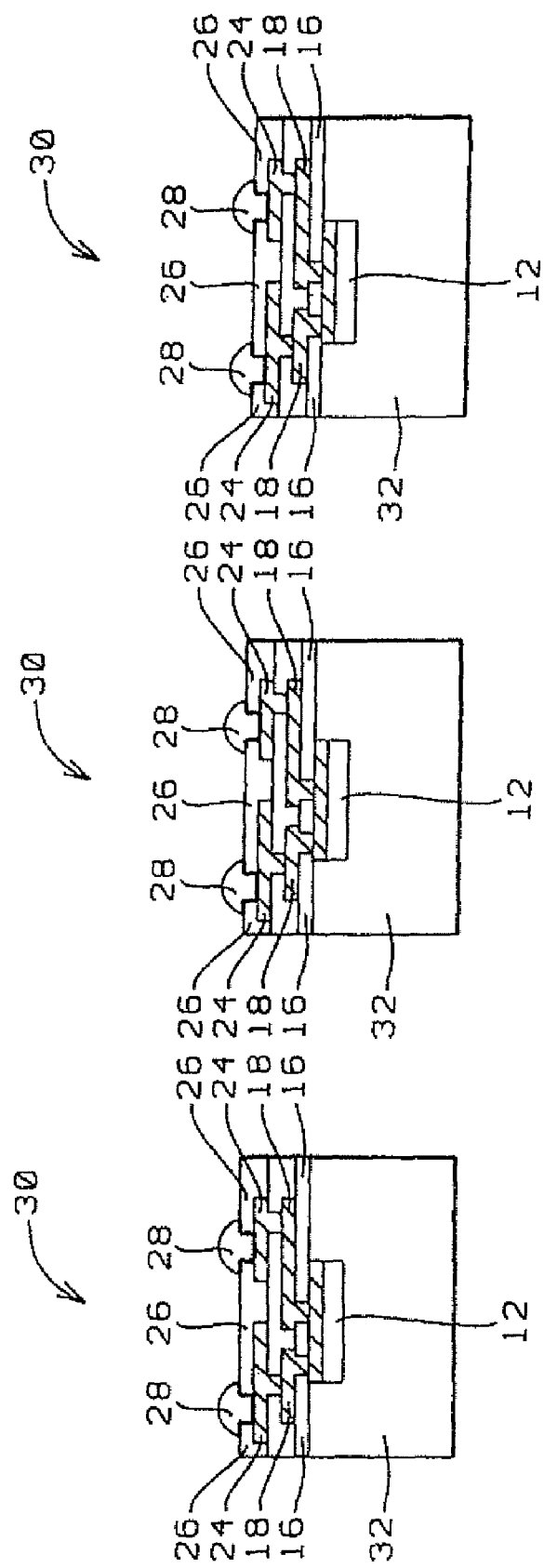
Figure 3A:
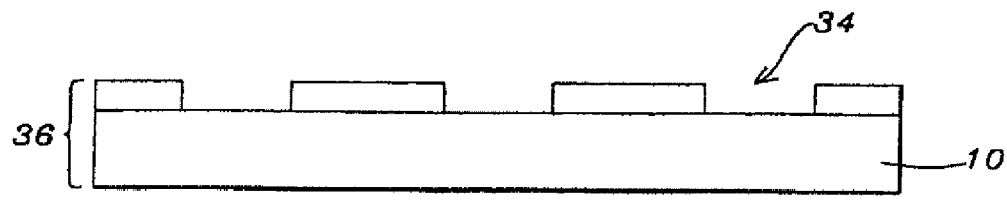
FIGS. 3a-3j show a third embodiment of the invention and the major fabrication steps.
Figure 3B:
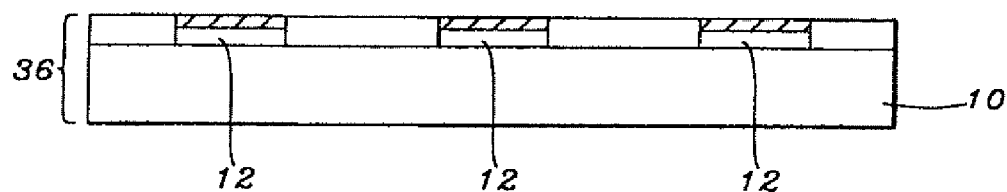
Figure 3C:
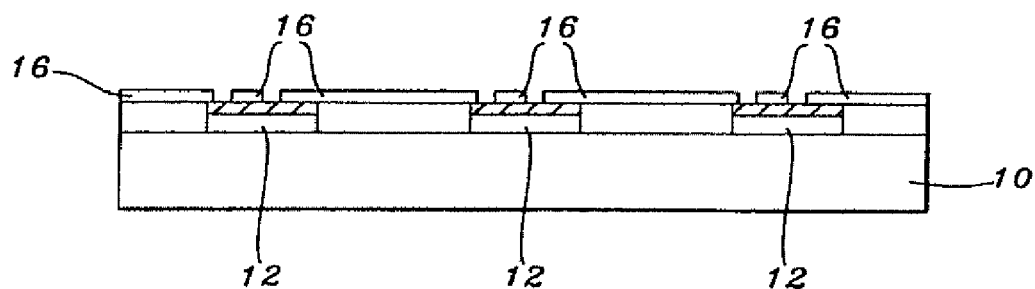
Figure 3D:
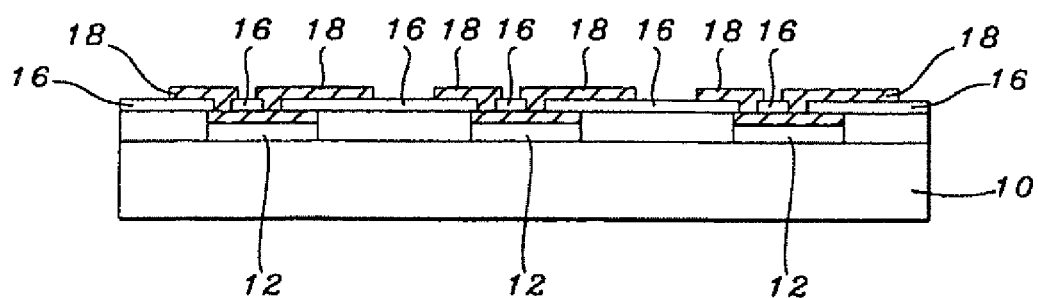
Figure 3E:
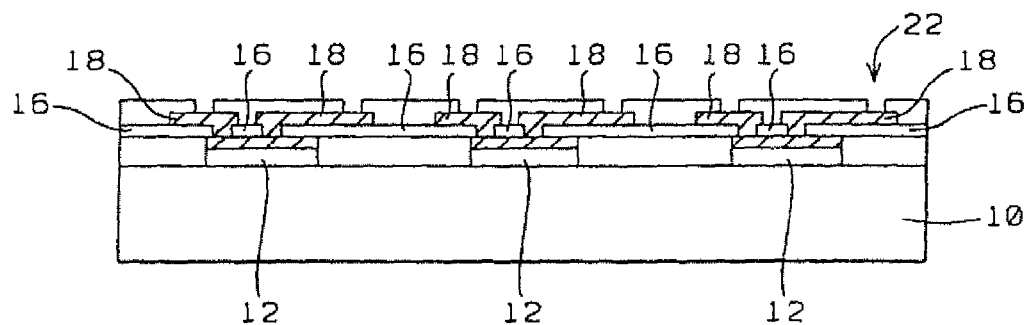
Figure 3F:
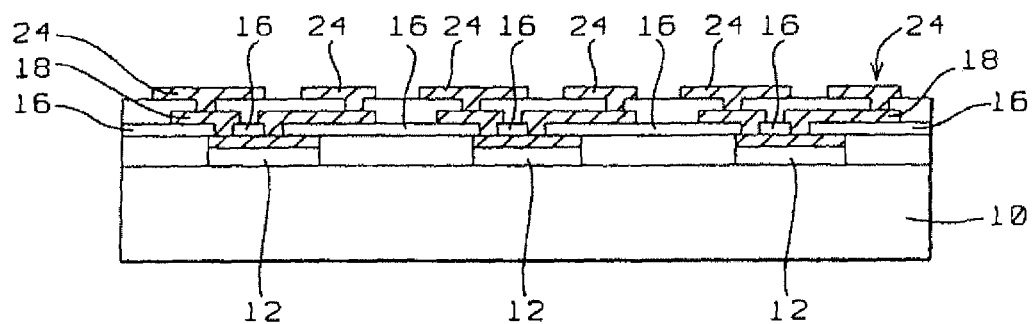
Figure 3G:
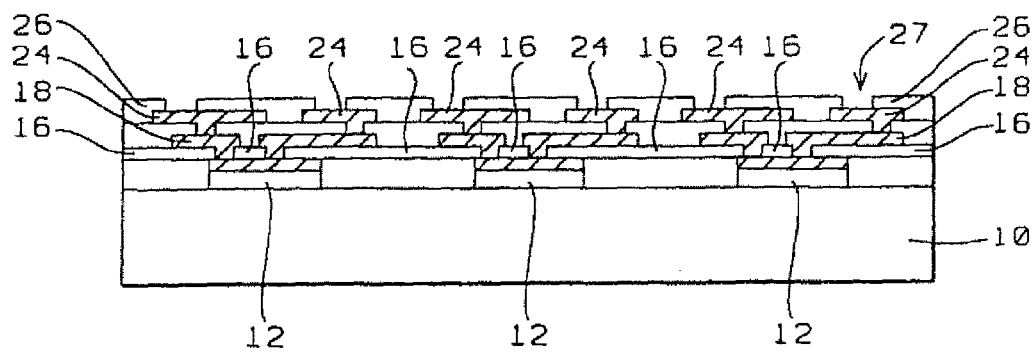
Figure 3H:
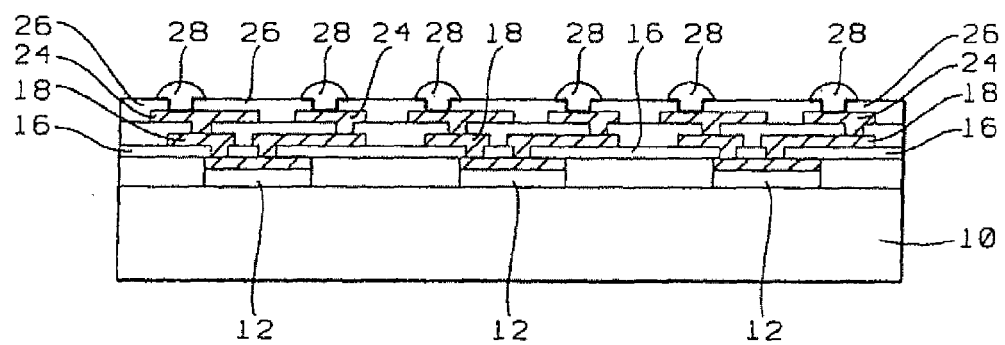
Figure 3I:
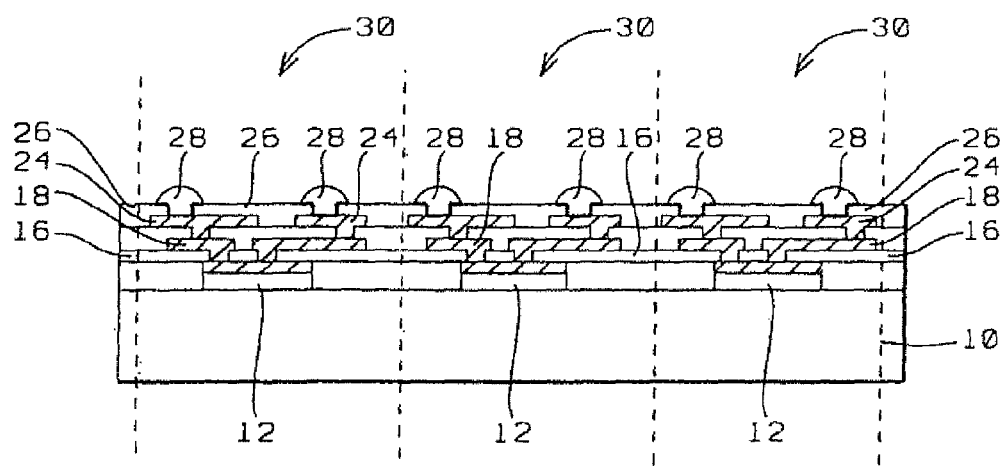
Figure 3J:
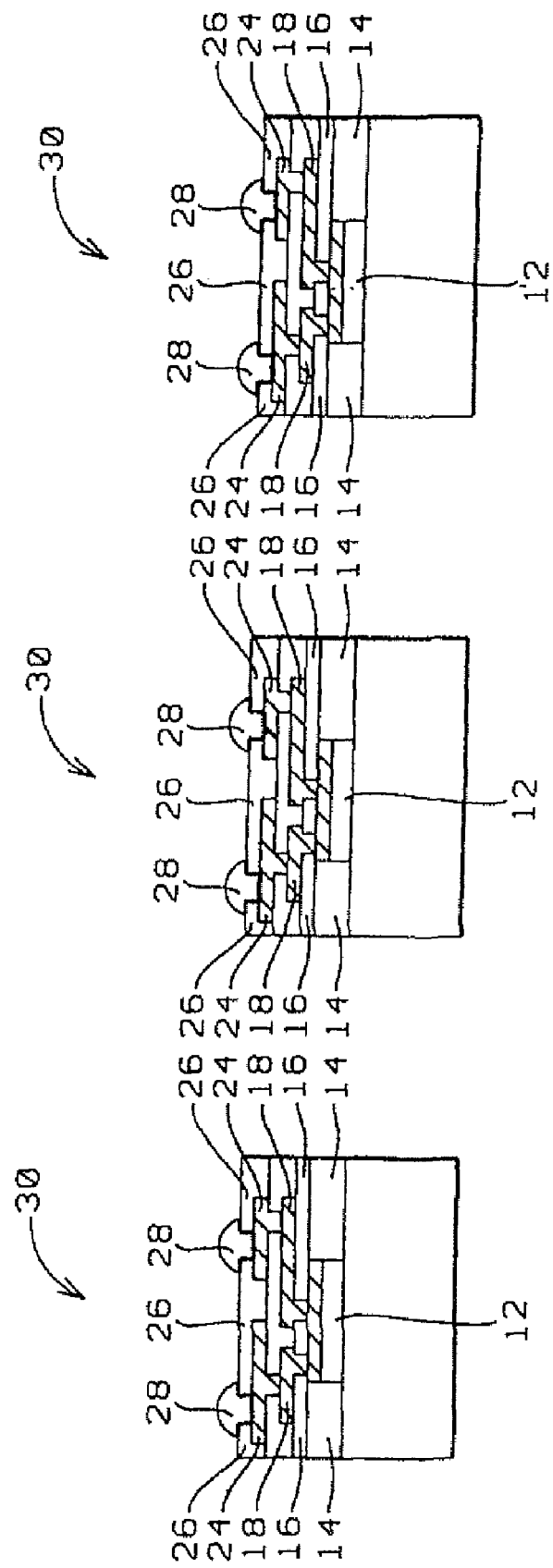
Figure 4A:
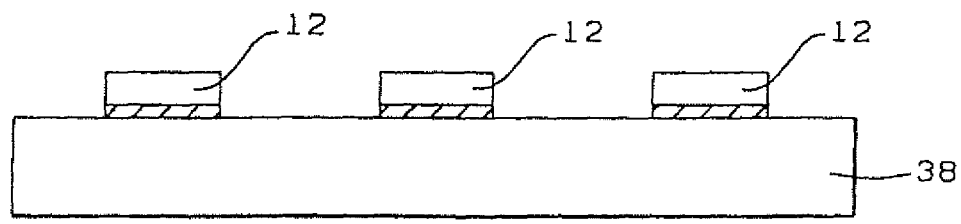
FIGS. 4a-4l show a fourth embodiment of the invention and the major fabrication steps.
Figure 4B:
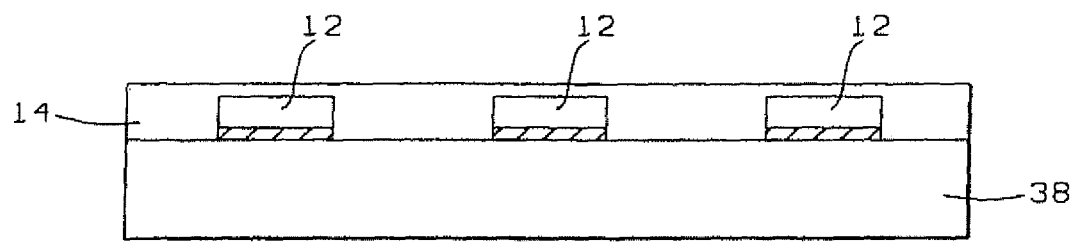
Figure 4C:
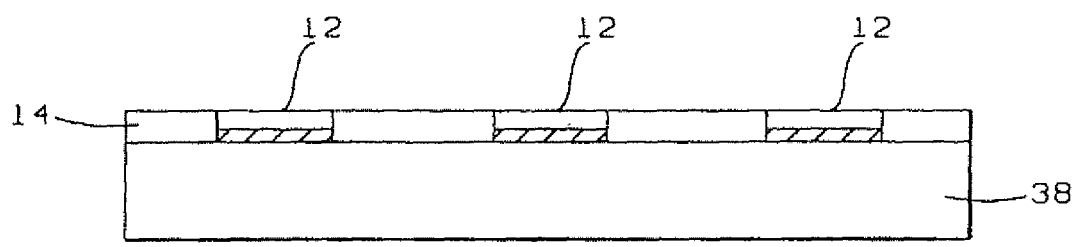
Figure 4D:
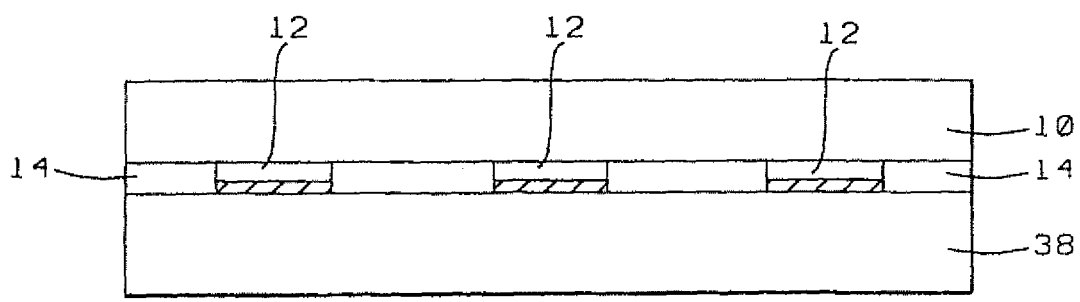
Figure 4E:
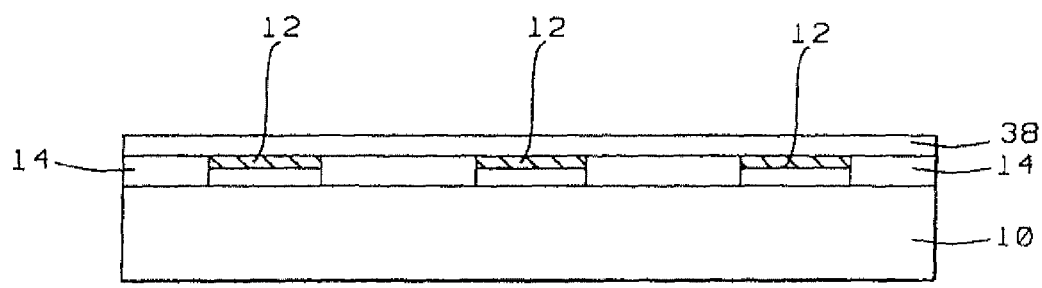
Figure 4F:
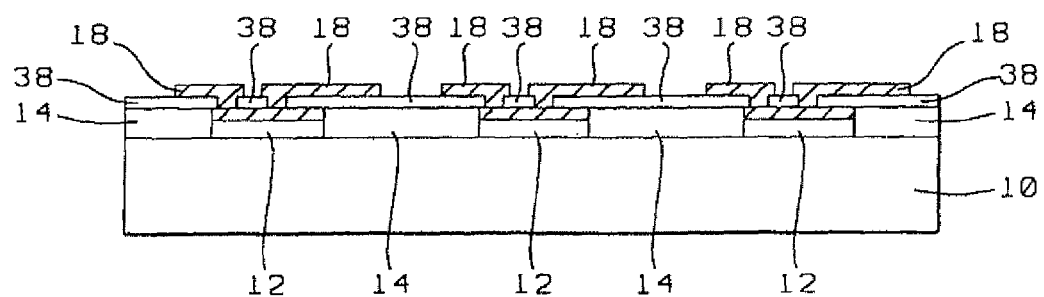
Figure 4G:
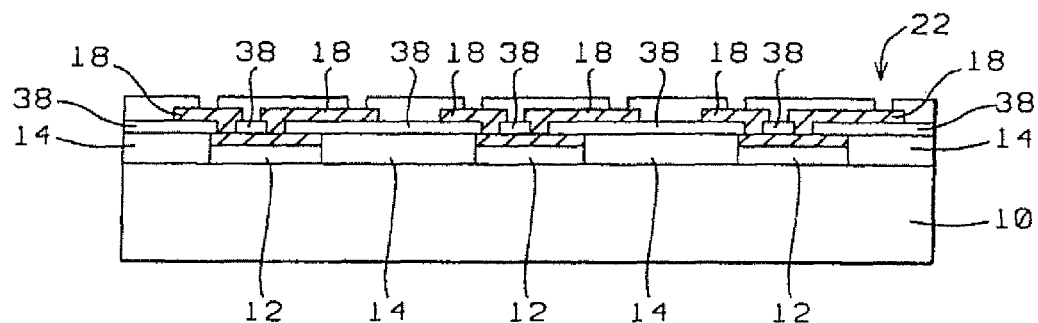
Figure 4H:
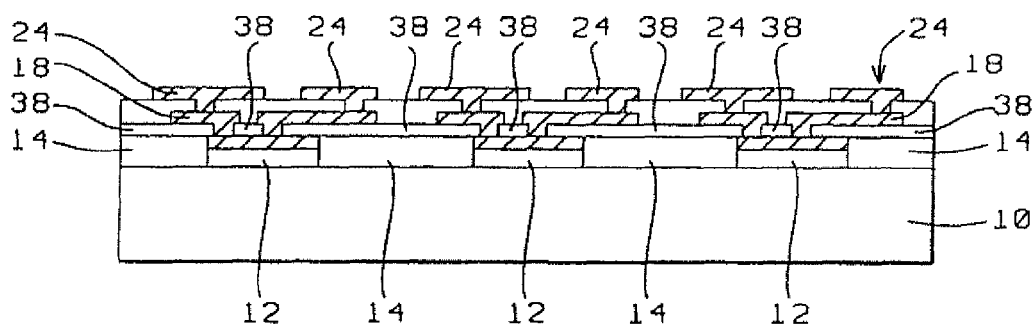
Figure 4I:
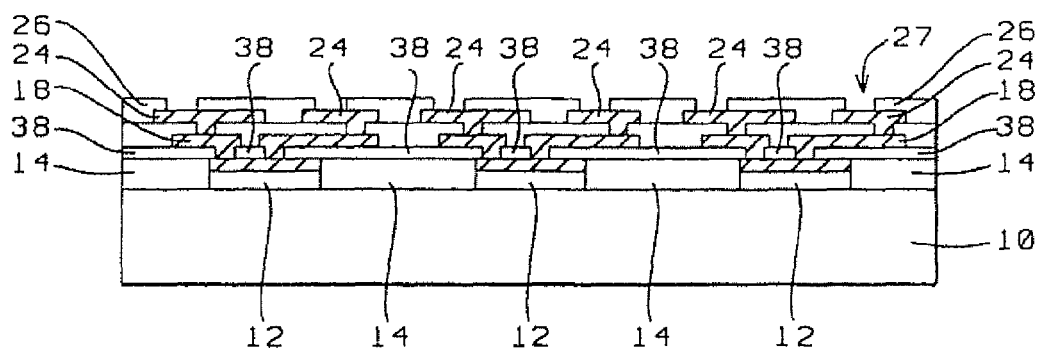
Figure 4J:
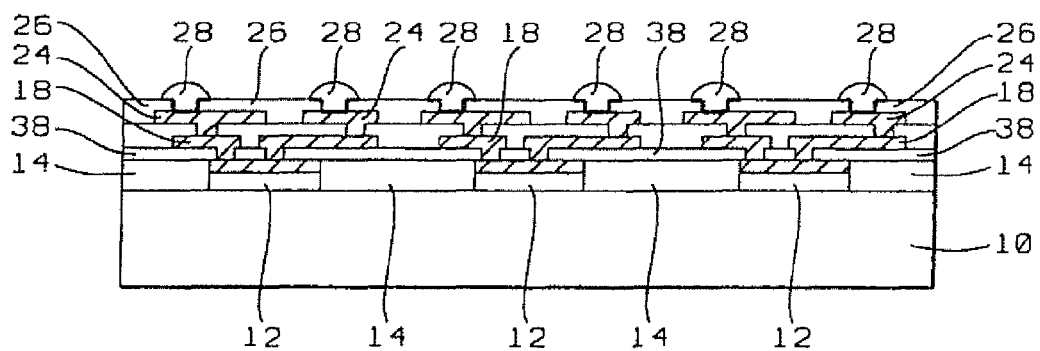
Figure 4K:
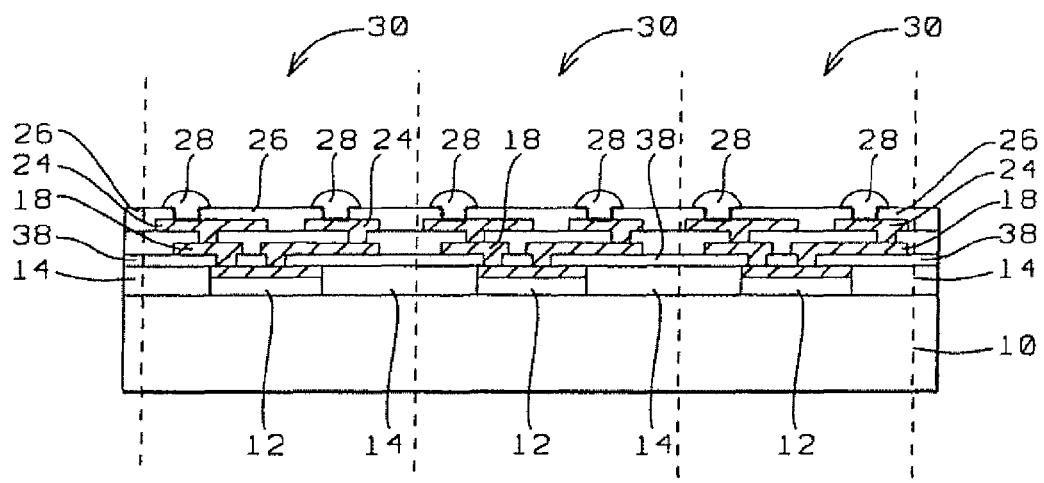
Figure 4L:
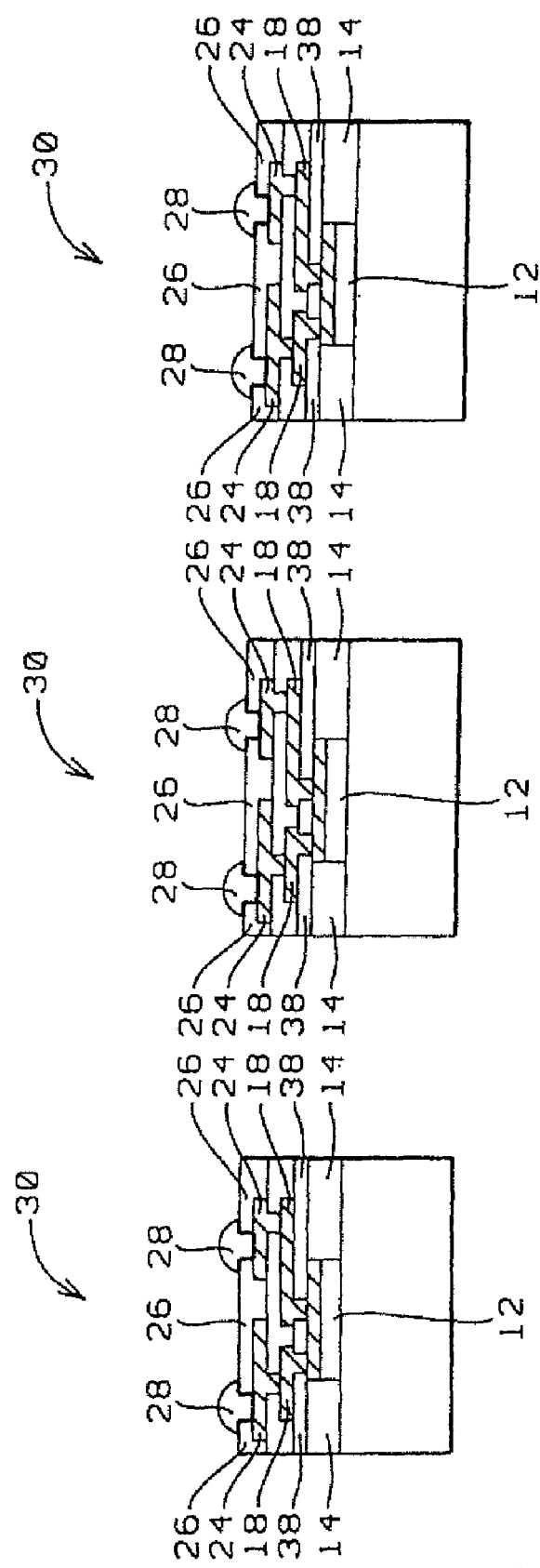
Figure 5A:
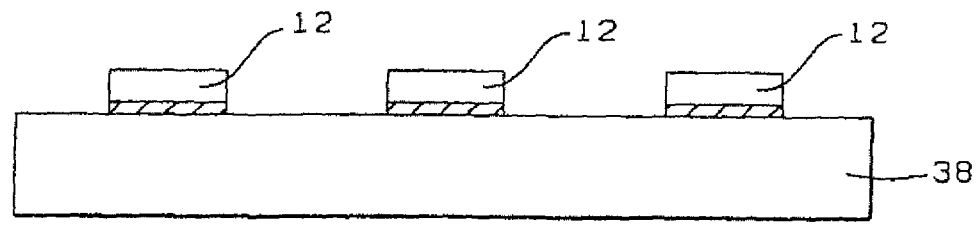
FIGS. 5a-5l show a fifth embodiment of the invention and the major fabrication steps.
Figure 5B:
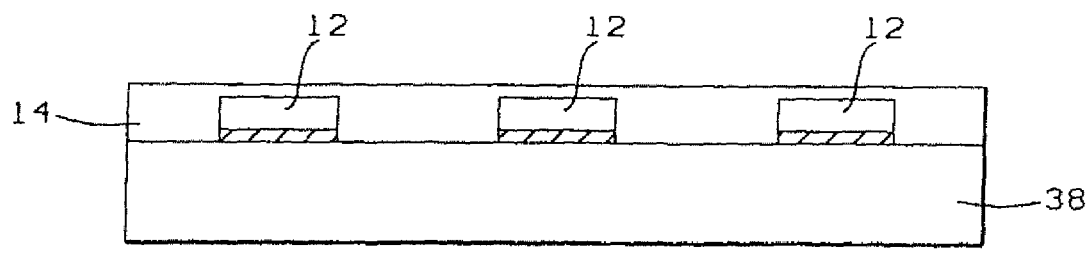
Figure 5C:
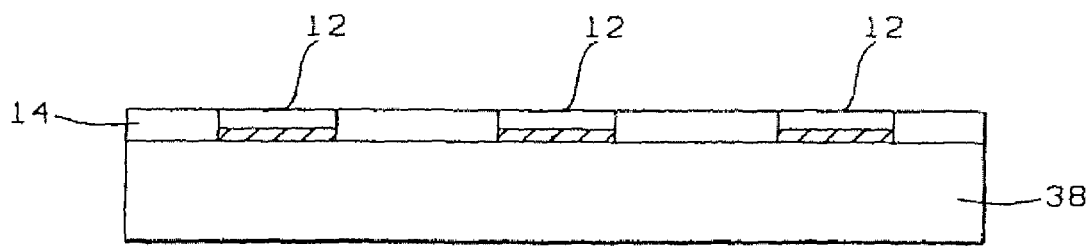
Figure 5D:
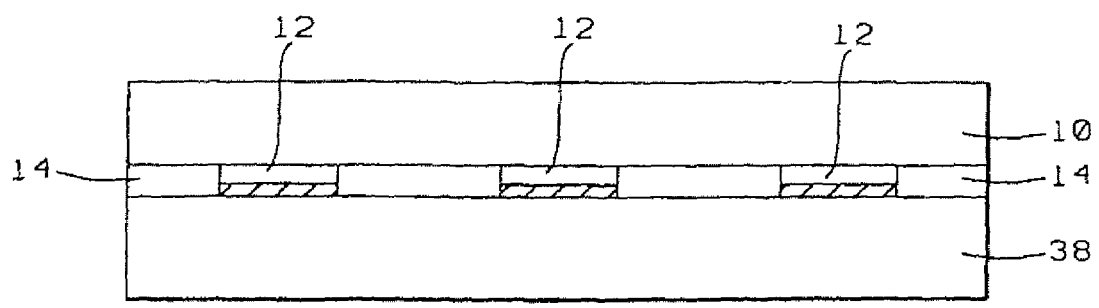
Figure 5E:
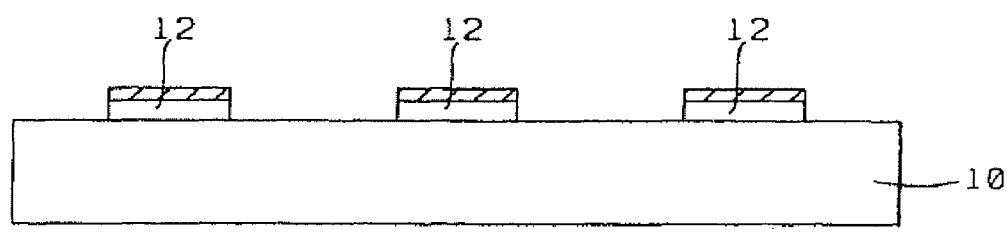
Figure 5F:
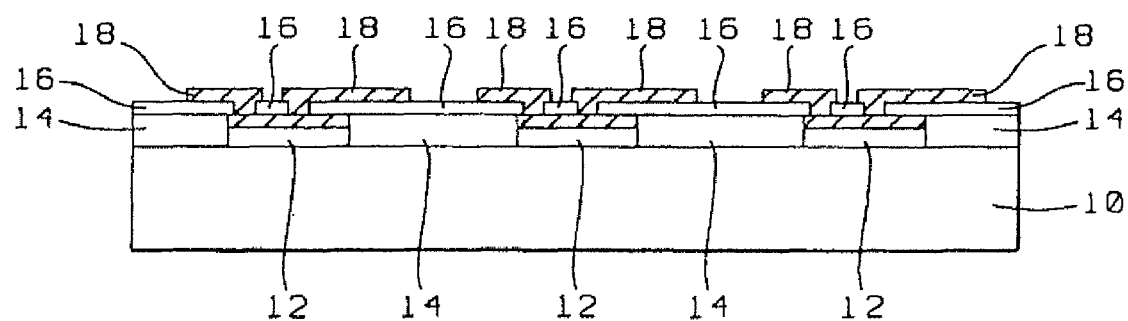
Figure 5G:
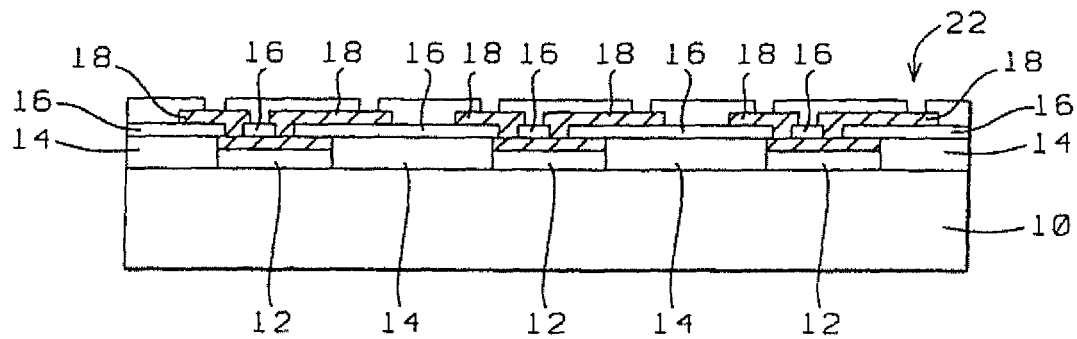
Figure 5H:
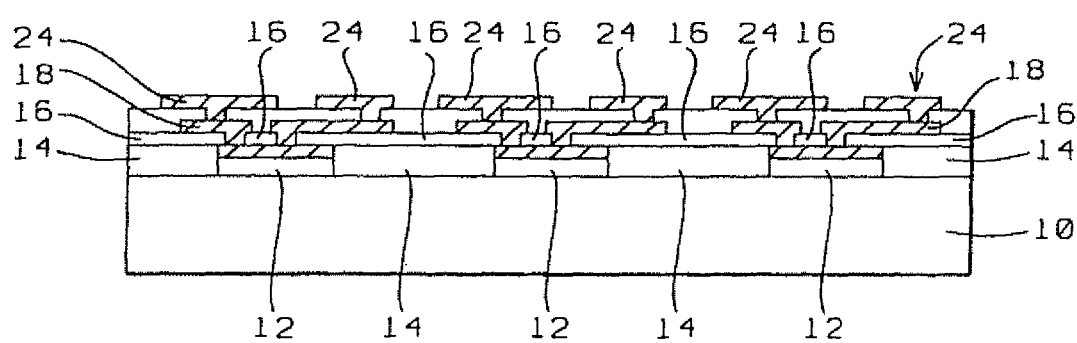
Figure 5I:
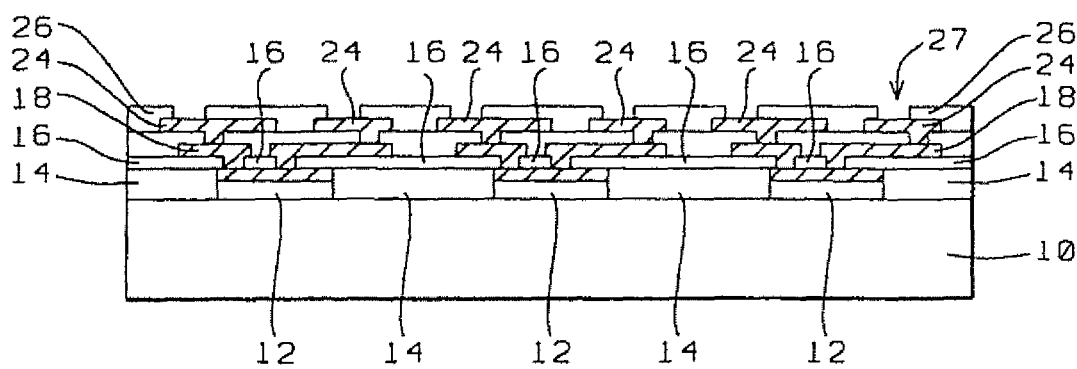
Figure 5J:
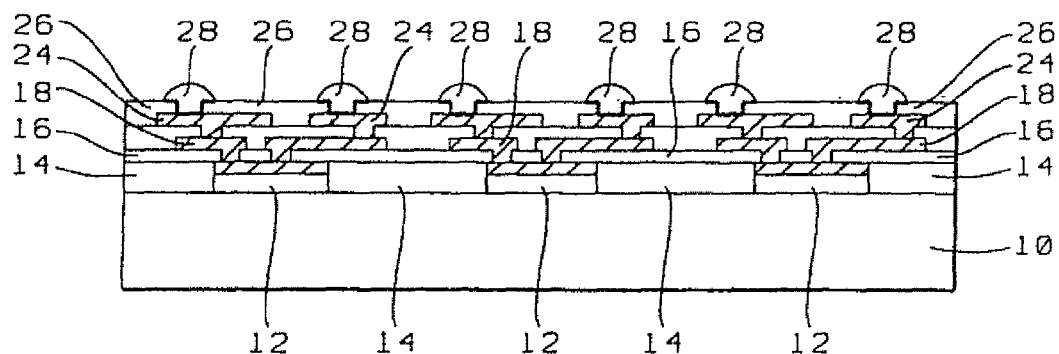
Figure 5K:
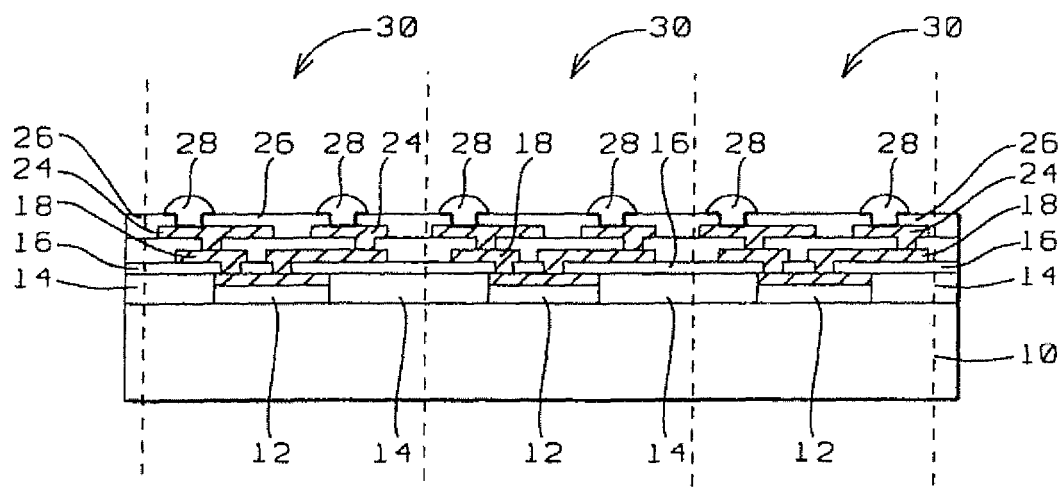
Figure 5L:
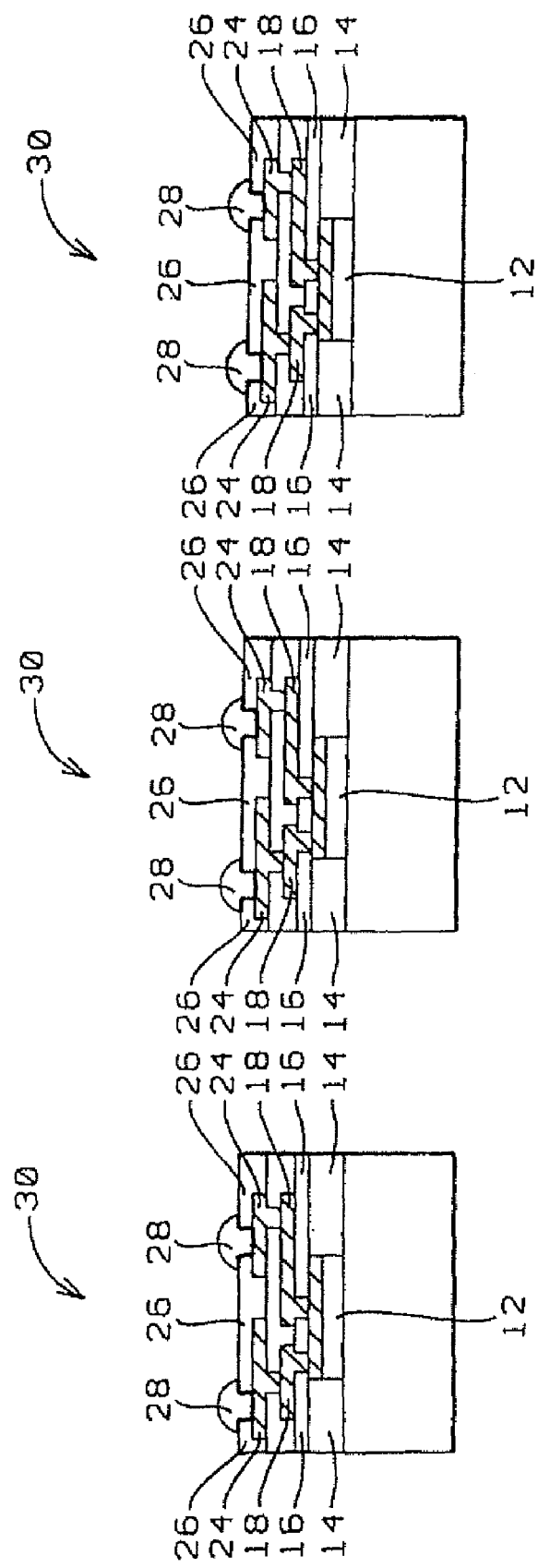

The first metal layer 18 is deposited by sputtering or electroplating and is patterned by photolithographic techniques. This layer contains the interconnects or fan-out lines and may contain passive components such as capacitors 40, inductors 45, resistors 50 (as shown in FIGS. 1k-1m), waveguides, filters, MEMS devices, and the like, that are required by the electrical design. The metal used is preferably copper but may be gold, aluminum or other conducting elements, and is deposited to a thickness of between about 1 and 150 μm.

The second layer of dielectric polymer 20 is formed by spin-on coating, screen printing or laminating, to a thickness of between about 1 and 150 μm, and patterned by photolithographic techniques. Chemical etching is used to open contact holes 22 to the first layer of metal 18. The polymer 20 can also be photosensitive material.

A second layer of metal 24 is then deposited, to a similar thickness as metal layer 18, by sputtering or electroplating to provide the necessary interconnects or fan-out to the terminals of the package or a third layer of metal if required.

Multiple alternating layers of dielectric and metal (not shown) may be deposited and patterned until the final layer of dielectric 26 is then deposited, on the last layer of metal 24, and holes opened to the contact points of metal layer 24.

A layer of solder is deposited by electroplating, screen printing or ball mounting and contacts are made through the etched holes in the insulating layer to the final metal layer. The solder is then reflowed to form the solder bumps 28. Alternately, gold bumps, or pins may be used, as is known in the art.

At this stage the panel is segmented. If the product is a single chip package, it is segmented into individual single chip modules 30, as shown in FIGS. 1i and 1j. Each chip package 30 includes only one semiconductor die 12. If the product application is a multi-chip package, it would include interconnections (not shown) between the dies, and segmenting would be performed so that the interconnected dies were not segmented from one another. In the case of multi-chip packages, each chip within the multi-chip package can be the same type (e.g., memory, logic, etc.) or they may be of different types.

The second embodiment of the present invention shown in FIGS. 2a-2j also utilizes thin film polymer material for the insulating layer of the interconnect structure. The major fabrication steps are the same as the first embodiment shown in FIG. 1 with the exception that the glass substrate 32 used has cavities 34 to house the semiconductor dies, and that allow the semiconductor dies 12 to have a common planar surface for the application of the first dielectric layer 16. The cavities are formed by etching to a depth of about the thickness of the die, which is typically between about 30 and 750 μm.

The third embodiment of the present invention shown in FIGS. 3a-3j utilizes a glass-metal composite as the substrate 36. The glass layer is etched with cavities, using the underlying metal as an etch stop, that allow the semiconductor dies 12 to be bonded and to have a common planar surface for the application of the first dielectric layer 16. Alternately, holes may be punched in the glass sheet and the sheet laminated to the metal substrate. In addition the thermal path from the chip is improved by bonding to the metal substrate which acts as a thermal spreader. The thin film interconnect structure is the same as in the previous embodiments.

The fourth embodiment of the present invention as shown in FIGS. 4a-4l utilizes a glass substrate with the semiconductor dies mounted with the active surface on the glass substrate 38, or face down. A polymer or epoxy is used to fill the gap between dies and may cover dies also. The polymer or epoxy is used for planarization purposes. The surface is then ground to the desired thickness. CMP (Chemical Mechanical Planarization) may be used in the grinding. The first glass is used for the leveling of the active surface of the semiconductor dies A second glass substrate 10 is then bonded to the back side of the semiconductor dies 12. The first glass substrate 38 is thinned by backside grinding to a thickness of 2 μm to 150 μm depending on the electrical design of the interconnect. Vias are etched in the thin glass substrate layer 38 to contact the semiconductor dies. The thin film interconnect layers are then formed as in the previous embodiments. Multiple bumps 28 are then formed on the topmost patterned circuit layer 24. The glass substrates 10 and 38 and multiple polymer layers 14 and 26 are segmented into individual single chip modules 30.

The fifth embodiment of the present invention shown in FIGS. 5a-5l utilizes a glass substrate 38 with the semiconductor dies mounted face down on the surface. A coating of a polymer or epoxy is deposited and the surface including the back of the semiconductor dies is ground to the desired thickness. Leveling of the surface is important for the follow-on thin film process. A second glass substrate is bonded to the back of the thinned semiconductor dies and the first glass substrate is removed. The thin film process is then completed as described above. Multiple bumps 28 are then formed on the topmost patterned circuit layer 24. The glass substrate 10 and multiple polymer layers 14 and 26 are segmented into individual single chip modules 30.

In each of the above embodiments, the interconnect metal may be used to form interconnections between one or more points of electrical contact on each of the semiconductor dies.

The present invention as described in the five embodiments provides wiring structures and methods to obtain them, that have the ability of greater fan-out from the semiconductor dies, with wiring structures that are far superior to the post passivation process described earlier and/or wafer level packages. The structures described above also have the ability to provide for a variety of passive components, e.g., capacitors, inductors, etc., internal to the wiring structure. These structures may be used in single chip fan-out packages or as interconnections between chips or multi-chip packages. Another advantage of the present invention is the ability to utilize present manufacturing equipment such as used in the manufacture of glass LCD panels Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip package comprising:
   a first polymer layer;
   a semiconductor die between a first portion of said first polymer layer and a second portion of said first polymer layer, wherein said semiconductor die has a top surface substantially coplanar with a top surface of said first polymer layer;
   a second polymer layer on said semiconductor die and said first polymer layers, wherein said second polymer layer has a thickness between 5 and 100 micrometers;
   a first patterned metal layer over said semiconductor die, said second polymer layer and said first polymer layer, wherein said first patterned metal layer is connected to said semiconductor die through an opening in said second polymer layer, wherein said first patterned metal layer comprises an electroplated metal and has a thickness between 1 and 150 micrometers, wherein said first patterned metal layer comprises a piece as a part of a capacitor;
   a third polymer layer on said first patterned metal layer and over said second polymer layer, said semiconductor die and said first polymer layer, wherein said third polymer layer has a thickness between 1 and 150 micrometers; and
   a metal bump vertically over said first polymer layer, wherein said metal bump is connected to said semiconductor die through said first patterned metal layer.

2. The chip package of claim 1 further comprising a substrate under said semiconductor die and said first and second portions of said first polymer layer.

3. The chip package of claim 2, wherein said substrate comprises glass.

4. The chip package of claim 1, wherein said electroplated metal comprises electroplated copper.

5. The chip package of claim 1, wherein said second polymer layer comprises polyimide.

6. The chip package of claim 1, wherein said first polymer layer comprises an epoxy.

7. The chip package of claim 1 further comprising a second patterned metal layer on said third polymer layer and over said semiconductor die and said first polymer layer, wherein said second patterned metal layer comprises a sputtered metal, wherein said second patterned metal layer is connected to said first patterned metal layer through an opening in said third polymer layer, wherein said metal bump is connected to said first patterned metal layer through said second patterned metal layer.

8. A chip package comprising:
   a first polymer layer;
   a semiconductor die between a first portion of said first polymer layer and a second portion of said first polymer layer, wherein said semiconductor die has a top surface substantially coplanar with a top surface of said first polymer layer;
   a second polymer layer on said semiconductor die and said first polymer layer, wherein said second polymer layer has a thickness between 5 and 100 micrometers;
   a first patterned metal layer over said semiconductor die, said second polymer layer and said first polymer layer, wherein said first patterned metal layer is connected to said semiconductor die through an opening in said second polymer layer, wherein said first patterned metal layer comprises an electroplated metal and has a thickness between 1 and 150 micrometers, wherein said first patterned metal layer comprises a piece as a part of a resistor;
   a third polymer layer on said first patterned metal layer and over said second polymer layer, said semiconductor die and said first polymer layer, wherein said third polymer layer has a thickness between 1 and 150 micrometers; and
   a metal bump vertically over said first polymer layer, wherein said metal bump is connected to said semiconductor die through said first patterned metal layer.

9. The chip package of claim 8, wherein said electroplated metal comprises electroplated copper.

10. The chip package of claim 8, wherein said first polymer layer comprises an epoxy.

11. The chip package of claim 8, wherein said metal bump comprises a solder.

12. The chip package of claim 8 further comprising a substrate under said semiconductor die and said first and second portions of said first polymer layer.

13. The chip package of claim 12, wherein said substrate comprises glass.

14. The chip package of claim 8 further comprising a second patterned metal layer on said third polymer layer and over said semiconductor die and said first polymer layer, wherein said second patterned metal layer comprises a sputtered metal, wherein said second patterned metal layer is connected to said first patterned metal layer through an opening in said third polymer layer, wherein said metal bump is connected to said first patterned metal layer through said second patterned metal layer.

15. A chip package comprising:
   a first polymer layer;
   a semiconductor die between a first portion of said first polymer layer and a second portion of said first polymer layer, wherein said semiconductor die has a top surface substantially coplanar with a top surface of said first polymer layer;
   a second polymer layer on said semiconductor die and said first polymer layer, wherein said second polymer layer has a thickness between 5 and 100 micrometers;

a first patterned metal layer over said second polymer layer, said semiconductor die and said first polymer layer, wherein said first patterned metal layer is connected to said semiconductor die through an opening in said second polymer layer, wherein said first patterned metal layer comprises an electroplated metal and has a thickness between 1 and 150 micrometers, wherein said first patterned metal layer comprises a piece as a part of an inductor;

a third polymer layer on said first patterned metal layer and over said second polymer layer, said semiconductor die and said first polymer layer, wherein said third polymer layer has a thickness between 1 and 150 micrometers; and a metal bump vertically over said first polymer layer, wherein said metal bump is connected to said semiconductor die through said first patterned metal layer.

16. The chip package of claim 15, wherein said electroplated metal comprises electroplated copper.

17. The chip package of claim 15, wherein said first polymer layer comprises an epoxy.

18. The chip package of claim 15 further comprising a substrate under said semiconductor die and said first and second portions of said first polymer layer.

19. The chip package of claim 18, wherein said substrate comprises glass.

20. The chip package of claim 15 further comprising a second patterned metal layer on said third polymer layer and over said semiconductor die and said first polymer layer, wherein said second patterned metal layer comprises a sputtered metal, wherein said second patterned metal layer is connected to said first patterned metal layer through an opening in said third polymer layer, wherein said metal bump is connected to said first patterned metal layer through said second patterned metal layer.

21. A chip package comprising:
a first substrate comprising a glass substrate;
a semiconductor die having a bottom surface joined with said first substrate;
a second substrate having a bottom surface joined with a top surface of said semiconductor die, wherein a first opening in said second substrate is vertically over said semiconductor die and passes through said second substrate;
a first metal interconnect in said first opening and over said semiconductor die, wherein said first metal interconnect is connected to said semiconductor die through said first opening, wherein said first metal interconnect comprises electroplated copper; and
a metal bump connected to said semiconductor die through said first metal interconnect and said first opening.

22. The chip package of claim 21, wherein said second substrate comprises a glass substrate.

23. The chip package of claim 21, wherein said first metal interconnect is further over a top surface of said second substrate.

24. The chip package of claim 21 further comprising a dielectric layer on said first metal interconnect, wherein a second opening in said dielectric layer is over a contact point of said first metal interconnect, and said contact point is at a bottom of said second opening, wherein said metal bump is connected to said contact point through said second opening.

25. The chip package of claim 24 further comprising a second metal interconnect on a top surface of said dielectric layer and on said contact point, wherein said second metal interconnect comprises an electroplated metal, wherein said second metal interconnect is connected to said first metal interconnect through said second opening, wherein said metal bump is connected to said first metal interconnect through said second metal interconnect.

26. The chip package of claim 21, wherein said first metal interconnect extends across an edge of said semiconductor die.

27. The chip package of claim 21, wherein said top surface of said semiconductor die is an active surface of said semiconductor die.

28. The chip package of claim 21, wherein said bottom surface of said semiconductor die is at a backside of said semiconductor die.

29. The chip package of claim 21, wherein said metal bump is horizontally offset from said first opening.

* * * * *